United States Patent
Honda et al.

(10) Patent No.: US 8,086,019 B2
(45) Date of Patent: Dec. 27, 2011

(54) METHOD OF CREATING MASTER DATA USED FOR INSPECTING CONCAVE-CONVEX FIGURE

(75) Inventors: Norihiro Honda, Kodaira (JP); Tomoyuki Kaneko, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 1018 days.

(21) Appl. No.: 11/994,197

(22) PCT Filed: Jun. 19, 2006

(86) PCT No.: PCT/JP2006/312241
§ 371 (c)(1),
(2), (4) Date: Jan. 14, 2008

(87) PCT Pub. No.: WO2007/000909
PCT Pub. Date: Jan. 4, 2007

(65) Prior Publication Data
US 2009/0226073 A1    Sep. 10, 2009

(30) Foreign Application Priority Data
Jun. 28, 2005    (JP) .................................. 2005-188161

(51) Int. Cl.
*G06K 9/00*    (2006.01)
(52) U.S. Cl. ....................................................... 382/141
(58) Field of Classification Search .................. 382/141, 382/173, 174, 282, 316, 108
See application file for complete search history.

(56) References Cited

U.S. PATENT DOCUMENTS

| | | | | |
|---|---|---|---|---|
| 3,918,816 A * | 11/1975 | Foster et al. | ................... | 356/602 |
| 4,095,464 A * | 6/1978 | Breedijk | ......................... | 73/146 |
| 4,873,651 A * | 10/1989 | Raviv | ............................. | 700/259 |
| 4,974,077 A * | 11/1990 | Kusaba | .......................... | 382/141 |
| 5,245,867 A * | 9/1993 | Sube et al. | ....................... | 73/146 |
| 5,465,304 A * | 11/1995 | Cullen et al. | .................... | 382/176 |
| 5,974,168 A * | 10/1999 | Rushmeier et al. | ............ | 382/141 |
| 6,529,645 B2 * | 3/2003 | Fåhraeus et al. | ............... | 382/313 |
| 6,728,593 B2 * | 4/2004 | Hu et al. | ........................ | 700/143 |
| 6,762,768 B2 * | 7/2004 | Dilliplane | ...................... | 345/582 |
| 6,802,130 B2 * | 10/2004 | Podbielski et al. | .............. | 33/288 |
| 6,828,980 B1 * | 12/2004 | Moreton et al. | ............... | 345/582 |
| 7,050,605 B2 * | 5/2006 | Gerson et al. | .................. | 382/100 |
| 7,343,789 B2 * | 3/2008 | Fujisawa et al. | ................ | 73/146 |

(Continued)

FOREIGN PATENT DOCUMENTS

JP    04-169803 A    6/1992

(Continued)

*Primary Examiner* — Gregory J Toatley
*Assistant Examiner* — Scott Richey
(74) *Attorney, Agent, or Firm* — Sughrue Mion, PLLC

(57) ABSTRACT

An image of respective figures is cut out by selecting a figure from tire CAD drawings, and an arranging position of the figure is set in accordance with a distance in a radial direction form a tire center and a deformed angle in a circumferential direction of the tire from a designated location, so that a height of respective regions of the cut-out image is set. Then, the cut-out image is transformed into an image having a gray scale in accordance with the height by using the height information of respective regions, and, at an arranging position of the figure, the image having a gray scale is sampled by a predetermined interval in a radial direction from a tire center and is sampled by a predetermined angle interval in a circumferential direction of the tire, so that master data are created by the image and a distance between intersecting points becomes equal.

4 Claims, 10 Drawing Sheets

U.S. PATENT DOCUMENTS

| | | | | |
|---|---|---|---|---|
| 7,565,005 B2* | 7/2009 | Sawada | | 382/154 |
| 7,565,032 B2* | 7/2009 | Oaki et al. | | 382/300 |
| 7,672,485 B2* | 3/2010 | Chambard et al. | | 382/108 |
| 7,724,377 B2* | 5/2010 | Sakoda et al. | | 356/601 |
| 7,755,363 B2* | 7/2010 | Yang et al. | | 324/460 |
| 7,755,772 B2* | 7/2010 | Takahashi et al. | | 356/601 |
| 7,787,686 B2* | 8/2010 | Oaki et al. | | 382/141 |
| 7,792,351 B1* | 9/2010 | Toth et al. | | 382/141 |
| 7,889,208 B1* | 2/2011 | Moreton et al. | | 345/584 |
| 2010/0002244 A1* | 1/2010 | Iino et al. | | 356/601 |
| 2010/0246931 A1* | 9/2010 | Kim et al. | | 382/141 |
| 2010/0264760 A1* | 10/2010 | Matsui et al. | | 310/54 |

FOREIGN PATENT DOCUMENTS

| | | |
|---|---|---|
| JP | 07-237270 A | 9/1995 |
| JP | 10-115508 A | 5/1998 |
| JP | 10115508 A * | 5/1998 |

* cited by examiner

Outer frame (circumscribed quadrangle)

FIG. 11

| Image number | Arranging angle | Arranging diameter | Arranging standard position | Image size | Figure attribute flag | Front-back determining flag | File name |
|---|---|---|---|---|---|---|---|
| 1 | θ1 | R1 | X1,Y1 | px1,py1 | 11 | 0 | 0001.BMP |
| 2 | θ2 | R2 | X2,Y2 | px2,py2 | 11 | 0 | 0002.BMP |
| ... | ... | ... | ... | ... | ... | ... | ... |

METHOD OF CREATING MASTER DATA USED FOR INSPECTING CONCAVE-CONVEX FIGURE

TECHNICAL FIELD

The present invention relates to a method of creating master data used for inspecting concave-convex figure, which can inspect a shape of one or more figures formed by a concave-convex portion on a surface of tire.

RELATED ART

As a method of inspecting automatically a figure such as a character formed by a concave-convex portion on a surface of tire, there is known a method for inspecting whether the concave-convex portion is indicated adequately or not as a predetermined character string at a predetermined position (for example, referred to a patent literature 1), by: irradiating a light to a sidewall of tire to which the concave-convex portions is formed; picking-up a bright line on the sidewall formed by a light by means of an image pickup camera; reading and processing image data equivalent to a character or a character string; transforming the image data into a character string in accordance with the concave-convex portion; and comparing the transformed character string with a character string stored previously as master data.

Patent literature 1: Japanese Patent Laid-Open Publication No.10-115508

However, in the known inspecting method, since a figure portion cut-out from an image information, which is obtained by measuring an appearance of tire actually, is treated as master data, the master data are affected by various characteristics such as resolution, accuracy, field of view, blind corner, that are originated from a measuring apparatus. In addition, since the master data include a positional error occurred every measurements, an occurrence of variation is not inhibited.

Moreover, since a tire selected for creating master data have a variation and is not necessarily a standard center even if it lies in the standard, it is not possible to create the master data, which are a center of a comparison.

Further, in the case such that the tires have various tire sizes, since it is necessary to perform the measurements for all the tire sizes, it takes a lot of time to create a database of the master data.

DISCLOSURE OF THE INVENTION

The present invention has for its object to eliminate the drawbacks and to provide a method of creating master data used for inspecting a concave-convex figure, which can create accurate master data with no variation and can easily construct a database of the master data.

In order to achieve the object mentioned above, according to a first aspect of the invention, a method of creating master data used for inspecting a concave-convex figure formed on a surface of tire from tire computer-aided design (CAD) drawings, which have figures deformed according to a tire size and deformed into a sector form according to an arranging position in a radial direction from a tire center, and a height information of respective regions of the figure, comprises the steps of: cutting-out an image including the figure by selecting the figure from the tire CAD drawings; and transforming respective regions of the cut-out image into a gray scale in accordance with a height information of respective regions obtained from the tire CAD drawings.

In the first aspect of the invention, it is preferred that the improvement further comprises a step of: deforming the cut-out image in accordance with the tire size and the arranging position in a radial direction from the tire center in such a manner that it becomes an original figure before deforming the figure included in the cut-out image into the sector form.

Moreover, according to a second aspect of the invention, a method of creating master data used for inspecting a concave-convex figure formed on a surface of tire from tire CAD drawings, which have figures deformed according to a tire size and deformed into a sector form according to an arranging position in a radial direction from a tire center, and a height information of respective regions of the figure, comprises the steps of: cutting-out an image including the figure by selecting the figure from the tire CAD drawings; transforming respective regions of the cut-out image into a gray scale in accordance with a height information of respective regions obtained from the tire CAD drawings; and deforming the image transformed into a gray scale in accordance with the tire size and the arranging position in a radial direction from the tire center in such a manner that it becomes an original figure before deforming the figure included in the image transformed into a gray scale into the sector form.

Further, according to a third aspect of the invention, a method of creating master data used for inspecting a concave-convex figure formed on a surface of tire from tire CAD drawings, which have figures deformed according to a tire size and deformed into a sector form according to an arranging position in a radial direction from a tire center, and a height information of respective regions of the figure, comprises the steps of: cutting-out an image including the figure by selecting the figure from the tire CAD drawings; deforming the cut-out image in accordance with the tire size and the arranging position in a radial direction from the tire center in such a manner that it becomes an original figure before deforming the figure included in the cut-out image into the sector form; and transforming respective regions of the transformed image into a gray scale in accordance with a height information of respective regions obtained from the tire CAD drawings.

In the present invention, since the master data used for comparing with the concave-convex figure on the surface of the tire is created on the basis of the tire CAD drawings, there occurs no variation and thus the accurate master data can be created. Moreover, since it is possible to create the accurate master data having no variation, it is possible to improve a comparative accuracy when comparing with the concave-convex figure on the surface of tire.

Further, in the known method, in the case such that the tires to be inspected have various tire sizes, it is necessary to perform the measurements of master data for all the tire sizes. However, in the present invention, since the master data can be created not depending on the tire size and one master data is sufficient for one figure, it is possible to minimize an energy for constructing the database of the master data.

BRIEF DESCRIPTION OF THE DRAWINGS

FIG. 11 is a schematic view depicting one embodiment of the additional information data table.

BEST MODE FOR CARRYING OUT THE INVENTION

Prior to explain a method of creating master data according to the invention, an apparatus for inspecting a concave-convex figure of tire, in which the master data created according to the method of the invention are used, will be explained first.

Figure 1:
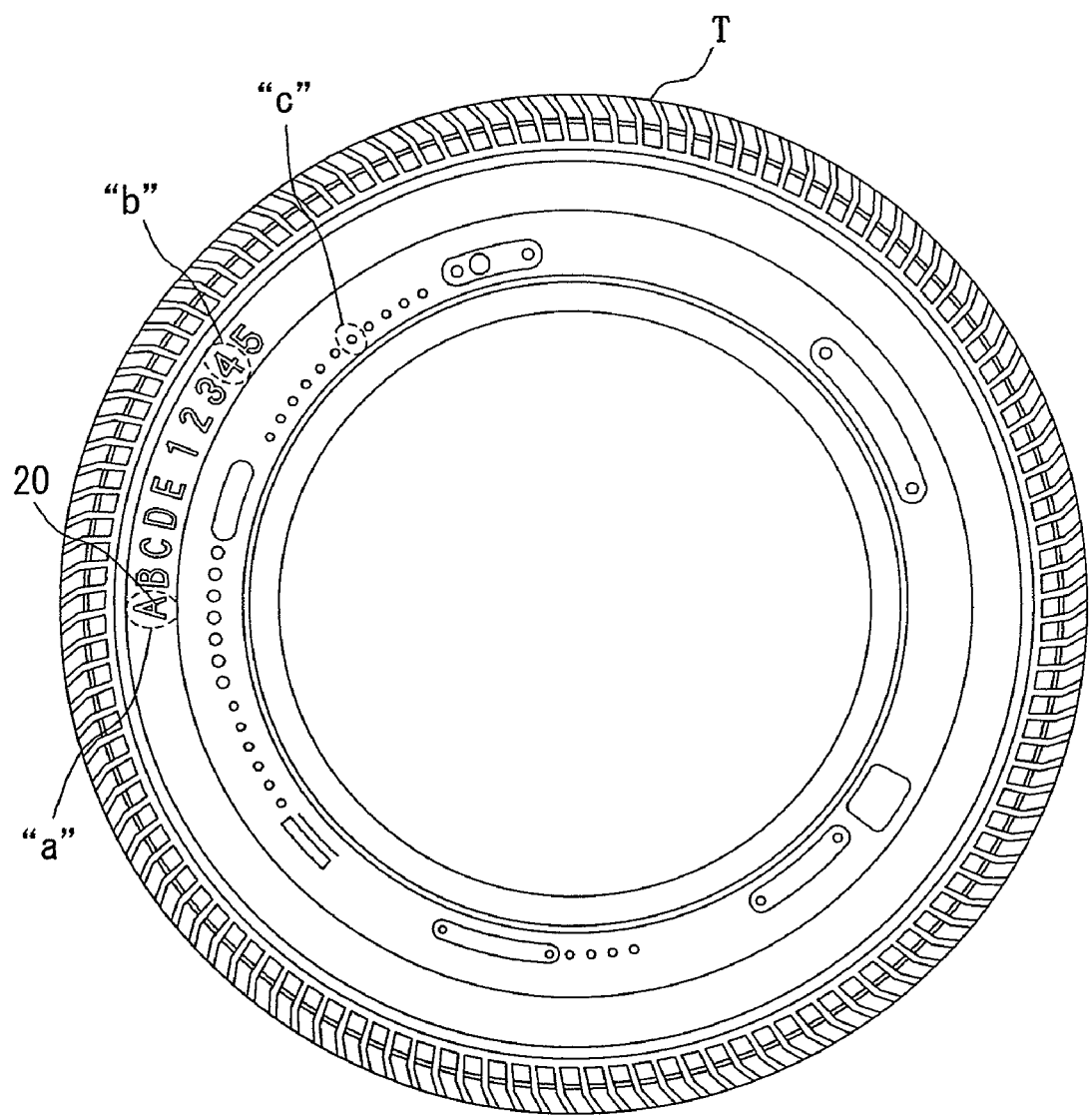
FIG. 1 is a front view schematically showing a surface of sidewall of tire on which a plurality of figures are arranged.

FIG. 1 is a front view schematically showing a surface of sidewall of tire T, to which a plurality of figures created by applying a concave-convex portion are formed, and, hereinafter, the explanation is made to a case such that a three-dimensional shape of a FIG. 20 indicated at "a" portion in FIG. 1. It should be noted that the figures indicated at "b" portion or "c" portion other than the "a" portion in FIG. 1 can be inspected in the same manner as that of the "a" portion.

Figure 2:
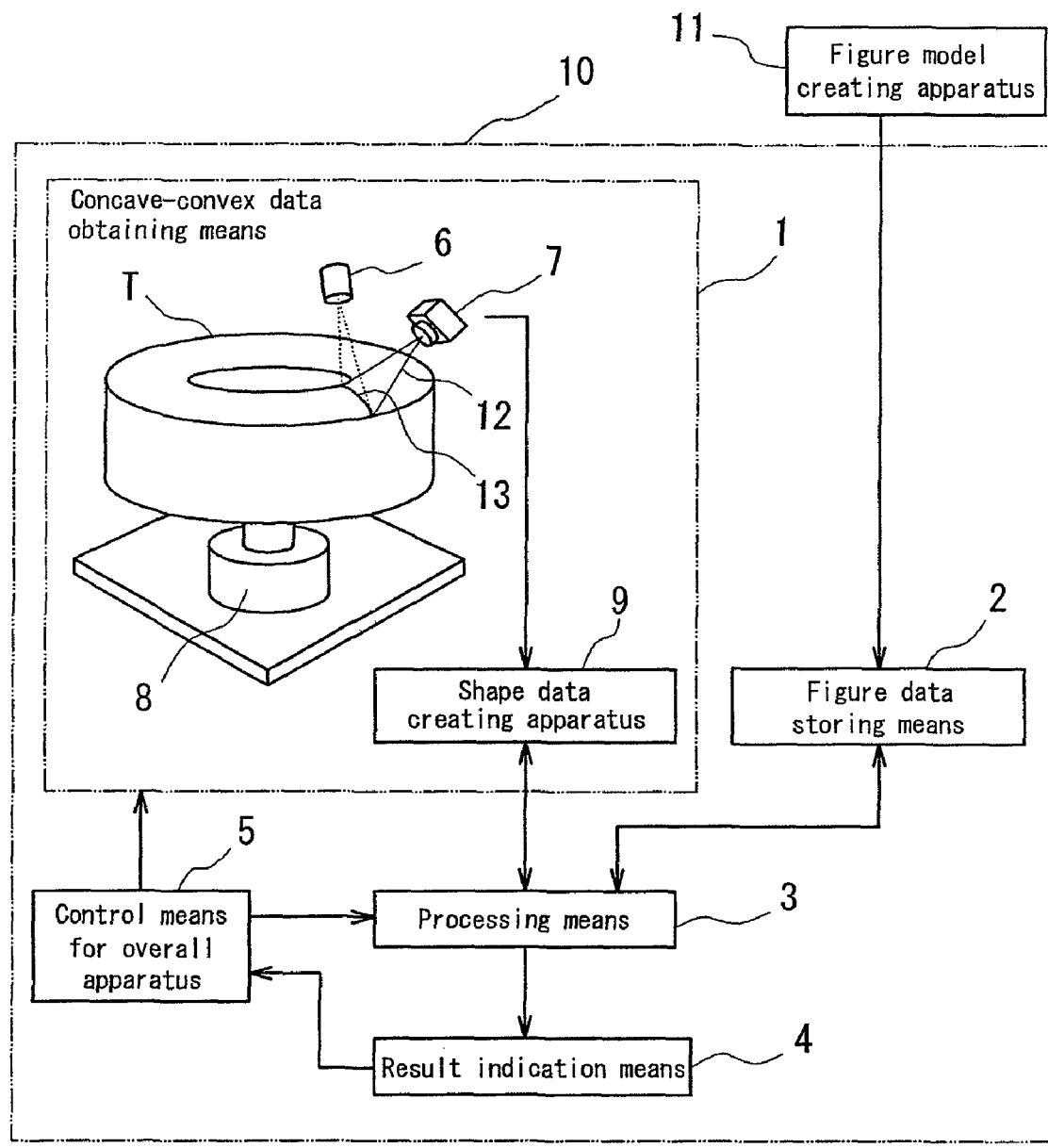
FIG. 2 is a schematic view illustrating an apparatus for inspecting a concave-convex figure of tire.

FIG. 2 is a schematic view showing an apparatus for inspecting a concave-convex figure of tire used for inspecting a three-dimensional shape of this figure. An apparatus for inspecting a concave-convex figure of tire 10 comprises: a concave-convex data obtaining means 1 for obtaining a concave-convex distribution data in a predetermined tire surface region including the FIG. 20; a figure data storing means 2 for storing a database having data (master data) of a figure model being a form of respective figures including the FIG. 20 and an additional information data table including a figure arranging information; a processing means 3 for specifying a tire surface portion corresponding to this figure model, on the basis of the concave-convex data obtaining means 1 and the data of the figure model input from the figure data storing means 2 and for determining whether or not the three-dimensional shape of the figure is acceptable, on the basis of a coincidence between the concave-convex distribution data of the specified tire surface portion and the data of the figure model; a result indication means 4 for outputting a determined result of the passing state; and a control means for overall apparatus 5 for controlling these means.

The concave-convex data obtaining means 1 comprises: a semiconductor laser 6 for irradiating a plain beam (sheet light) 12 spread in a fan-like form; a two-dimensional camera 7 for picking-up a bright line 13 formed on a sidewall surface of the tire T by the sheet light 12; a tire rotation driving apparatus 8 for rotating the tire at a predetermined rotation speed or for transferring a tire pitch by pitch in a circumferential direction by a predetermined pitch; a shape data creating apparatus 9 for inputting an image data from the camera 7 picked-up at a predetermined interval in a circumferential direction of tire, extracting the bright line 13 only from respective image data, and creating the three-dimensional concave-convex distribution data along overall surface regions of an annular tire.

A method of creating a profile of work (three-dimensional shape data) by gathering the images of bright lines formed on the work under such a condition that the sheet light is irradiated while transferring the work is generally called as a light-section method. In the concave-convex data obtaining means 1 according to this embodiment, the three-dimensional shape data can be accurately obtained directly from the picked-up images by utilizing the light-section method.

Figure 3:
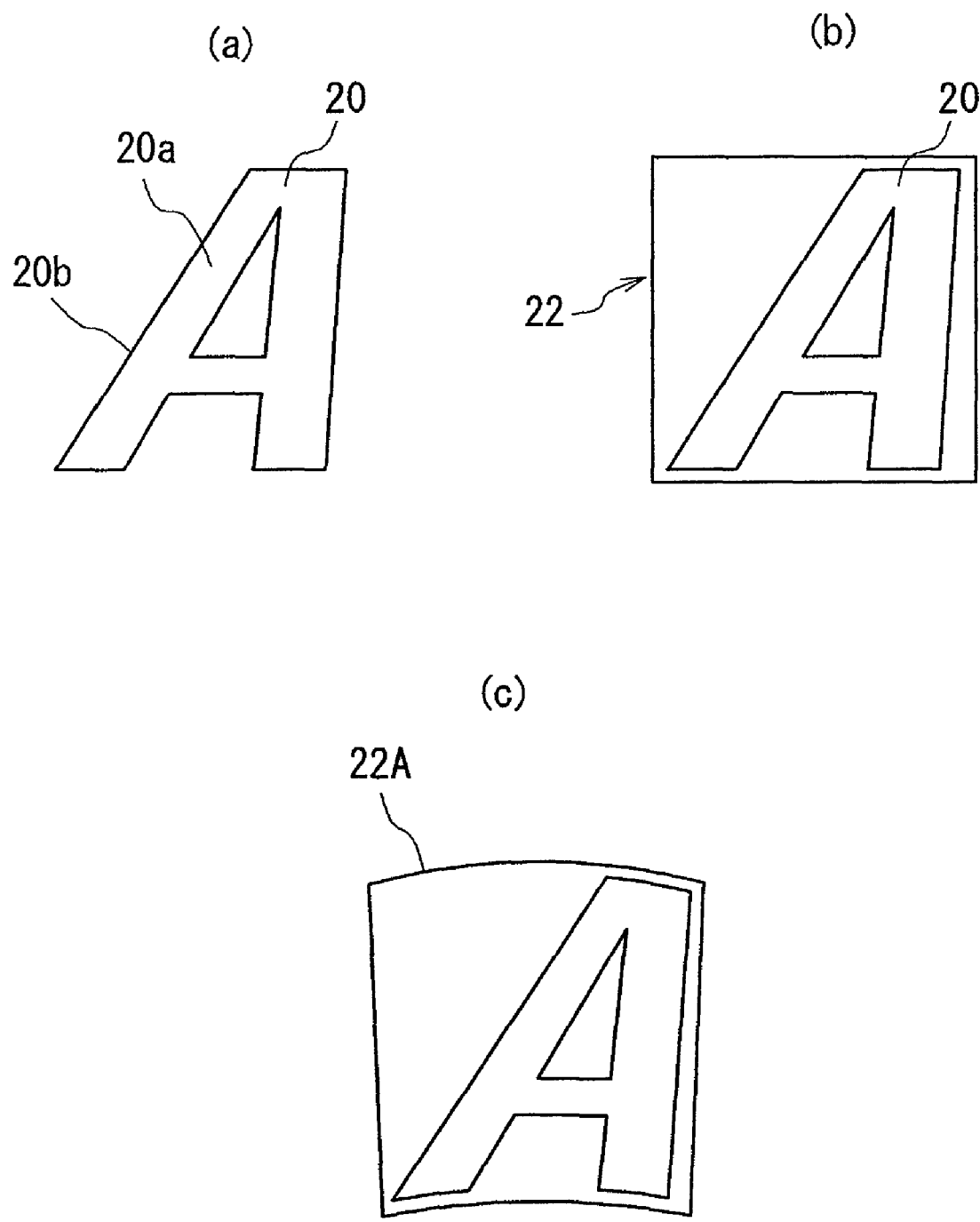
FIGS. 3a to 3c are schematic views respectively explaining a difference between the figure and the figure model.

Moreover, the figure data storing means 2 stores the data (master data) of the figure model. FIGS. 3a to 3c are schematic views respectively explaining a difference between the figure and the figure model, and FIG. 3a is a schematic view showing the FIG. 20 and FIG. 3b is a schematic view showing the figure model corresponding to the FIG. 20. In this embodiment, the FIG. 20 indicates a character "A". Generally, the figure is a portion to be inspected and indicates a portion obtained by joining a profile line 20b and an inner portion 20a formed by the profile lines 20b, while the figure model is a tool for being verified with the concave-convex distribution data. In the embodiment shown in FIG. 3b, the figure model 22 is indicated by a rectangular region including the FIG. 20 and its circumferential region.

The concave-convex distribution data created on the basis of the image data from the camera 7 show a surface profile of the actual tire as it is. Therefore, the actual concave-convex figure, which is obtained as the concave-convex distribution data and is formed on the surface of tire, has a shape such that an outer portion of tire in a radial direction is extended as compared with an inner portion of tire in a radial direction, with respect to the FIG. 20 exhibited in the figure model 22. In this case, when a tire surface portion corresponding to the figure model 22 is searched, or, when it is determined whether or not the figure is accepted, it is necessary to control a dimension of the figure model in such a manner that it is deformed into a sector form in accordance with a tire size and corresponding to a surface portion to be adjusted. To this end, the search and the acceptance determination mentioned above are performed by using a figure model after effecting deformations such as a polar coordination conversion and a size deformation, in which an origin is a center of tire with respect to the figure model 22. A schematic view shown in FIG. 3c is a figure model after deformation 22A, in which the polar coordination conversion and the size deformation are effected to the figure model 22.

As mentioned above, in order to create the figure model used for determining whether or not the tires having a plurality of sizes are accepted, the figure data storing means 2 stores the data (master data) of the figure model 22, which is a figure model before effecting the polar coordination conversion and the size deformation mentioned above and is exhibited by a rectangular coordinate system in which intersecting points are arranged at even intervals.

In addition, the figure data storing means 2 stores the additional information data table including an arranging position information of the figure model 22, other than the data of the figure model 22, with respect to the tire to be inspected. The arranging position information is formed by gathering specs relating to a center position of the figure model, on the annular tire surface region shown in FIG. 1. For example, the arranging position information of the figure model 22 is stored as the data of the center position of the figure model 22 in place exhibited by a distance R from the tire center and an angle θ in a circumferential direction on the basis of a predetermined mark and so on arranged on the surface of tire.

The processing means 3 comprises the steps of: obtaining the concave-convex distribution data about respective area components in a predetermined tire surface region including the FIG. 20 from the concave-convex data obtaining means 1, on the basis of a command from the control means for overall apparatus 5; obtaining the data of the figure model and the figure arranging information, which are preliminarily prepared, from the figure data storing means 2; setting the search area in the tire surface region, on the basis of the figure arranging information preliminarily prepared with respect to the FIG. 20; changing a position of the tire surface portion, which is to be corresponding to the figure model, in the search area; specifying the tire surface portion at which a coincidence between the concave-convex distribution data of the tire surface portion and the data of the figure model, which are calculated at respective positions, is largest, as the portion corresponding to the figure model; measuring the coincidence between the concave-convex distribution data of the specified tire surface portion and the data of the figure model, with respect to the FIG. 20; and determining whether or not the three-dimensional shape of the FIG. 20 is accepted on the basis of the coincidence mentioned above.

In the method of creating the master data for inspecting the concave-convex figure according to the invention, the data (master data) of the figure model mentioned above are created on the basis of a design CAD figure data of a die for forming the tire. Since the CAD figure data have no variation, in the method of creating the master data according to the invention, it is possible to create the accurate master data having no variation.

Hereinafter, the method of creating the master data for inspecting the concave-convex figure according to the invention will be explained.

Figure 4:
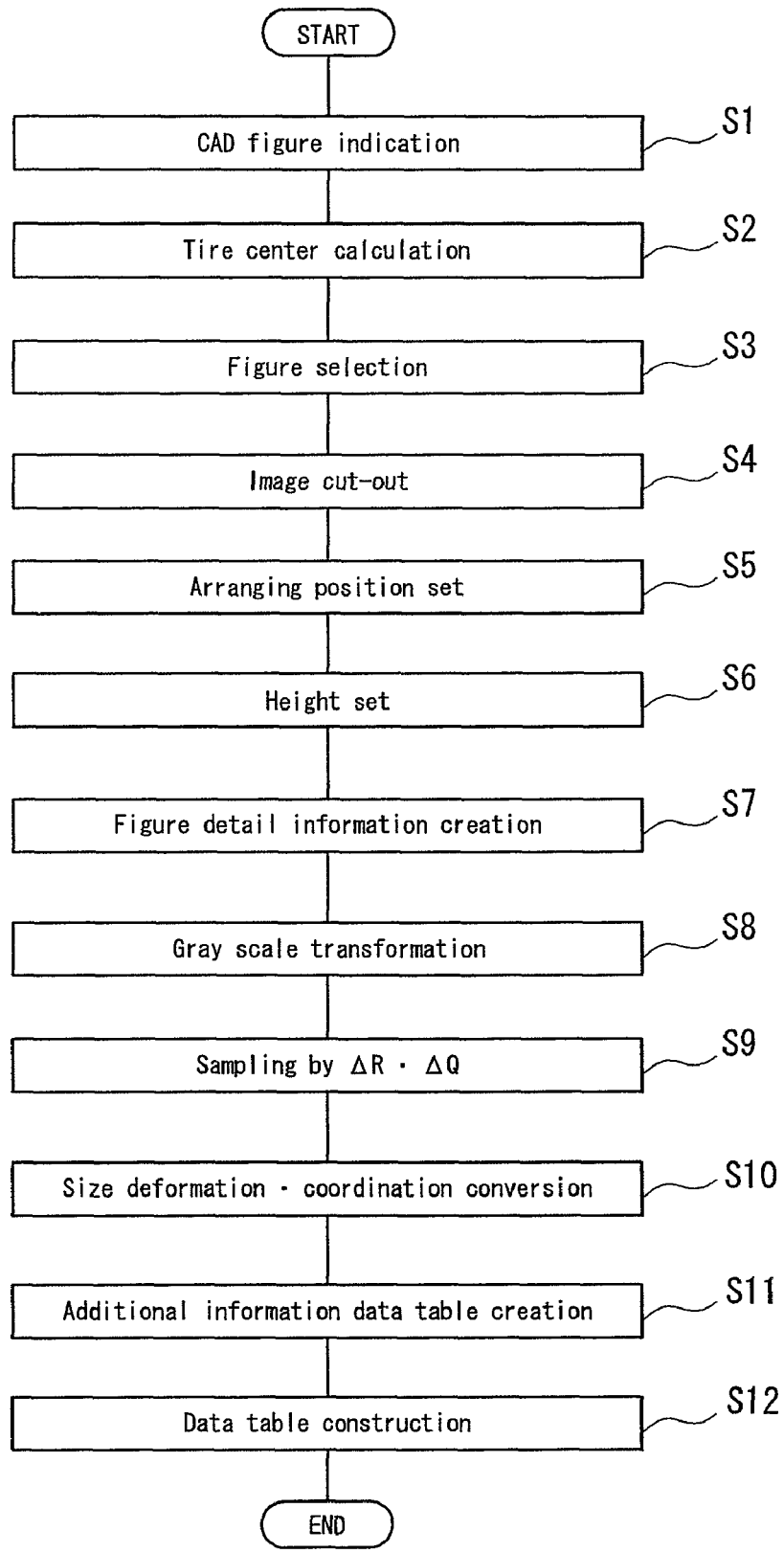
FIG. 4 is a flow chart showing a process performed by an apparatus for creating the figure model.

In FIG. 2, a numeral 11 is a figure model creating apparatus used for the method of creating the master data for inspecting the concave-convex figure according to the invention, and the figure model creating apparatus 11 is realized by performing a software program. FIG. 4 is a flow chart showing a process performed in the figure model creating apparatus 11.

The step of creating the master data comprises: a CAD data processing step for cutting-out an image including the figure from tire CAD figures and creating a figure detail information by adding a figure position information and a figure height information; a gray scale transforming step for transforming the cut-out image into gray scale data corresponding to the height by using the figure height information in the figure detail information; and a shape deforming step for deforming a shape by using the figure position information in the figure detail information.

First, the CAD data processing step will be explained. The figure model creating apparatus 11 functions to call CAD data from the design CAD figure files (for example, DXF file) of the die for forming the tire and to indicate the tire CAD figure on a display (step 1). Then, a center position of the tire is calculated from the tire CAD figure (step 2). In this case, the center position of the tire may be indicated manually by an operator.

Then, the figure is selected from the tire CAD figure (step 3). In this case, the figure may be selected manually by an operator. If the figure is selected from the tire CAD figure, a circumscribed quadrangle of the figure is formed by tangent lines in a radial direction and in a circumferential direction of the tire, and the image including the figure is cut-out and is registered as the data (step 4).

Figure 5:
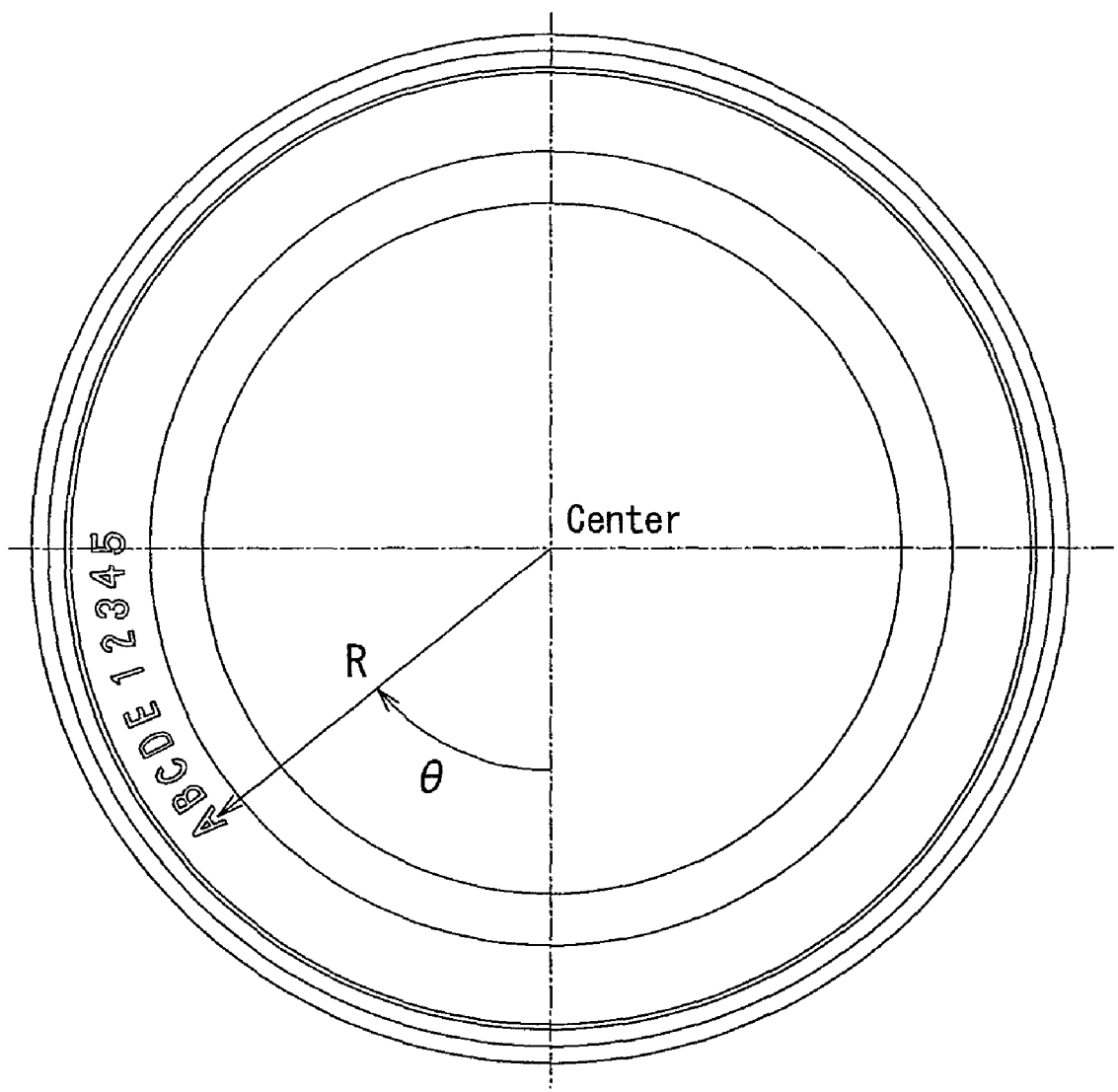
FIG. 5 is a schematic view illustrating an arranging position of the figure on the CAD drawing.

Then, the arranging position of the figure is set and registered by a distance R in a radial direction from a tire center of the circumscribed quadrangle (arranging diameter) and a displacement angle (arranging angle) θ in a radial direction of tire from a designated position (step 5). FIG. 5 is a schematic view showing the arranging position of the figure on the tire CAD figure.

Then, the height (depth) of respective regions is set and registered in such a manner that an area surrounded by lines on the cut-out figure is recognized as a region having a constant height by using the figure height information derived from the tire CAD figure (step 6). The height may be set and registered by opening a numerical value input window and inputting the height of respective regions of the figure successively from the outside. Further, a figure attribute flag indicating a kind of the figure is input by opening the numerical value input window.

Figure 6:
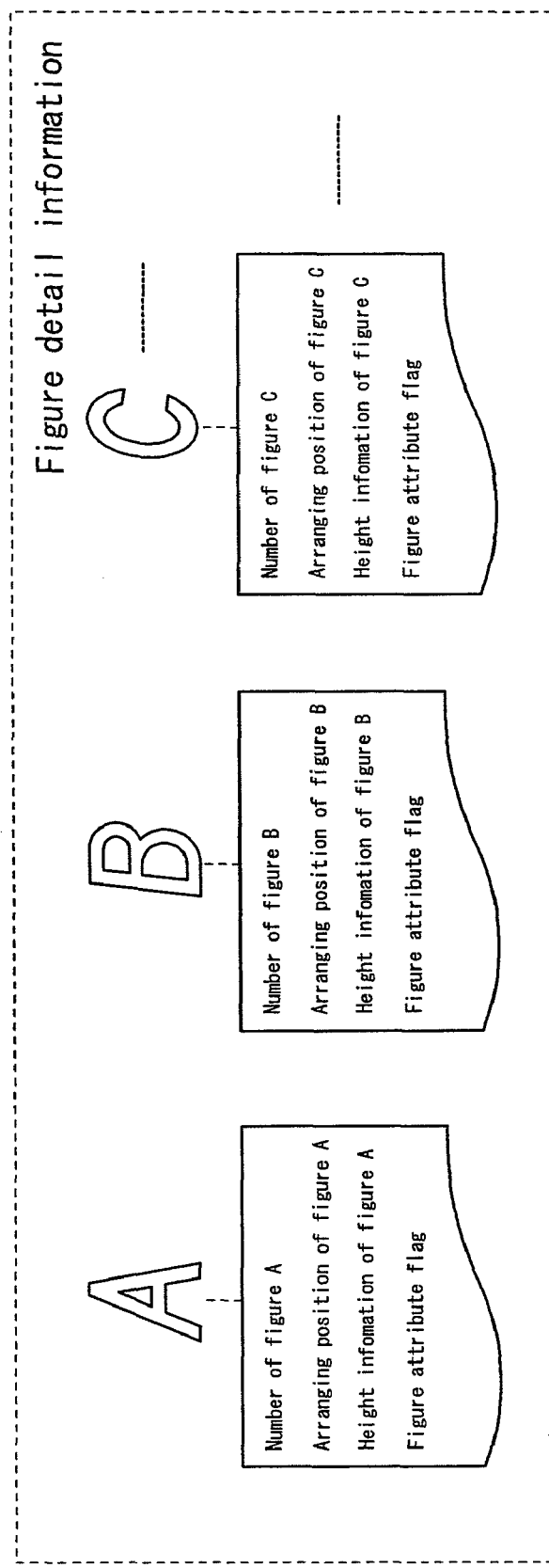
FIG. 6 is a schematic view depicting one embodiment of the figure detail information.

The figure detail information is created from information obtained as mentioned above (step 7). FIG. 6 shows one embodiment of the figure detail information. The figure detail information includes, at least, image data, figure number, arranging position of figure, height information of figure, figure attribute flag, with respect to respective cut-out figure.

Then, the gray scale transforming step will be explained. The figure model creating apparatus 11 transforms the image cut-out by the CAD data processing into the gray scale image corresponding to the height by utilizing the figure height information in the figure detail information (step 8). The gray scale is defined by a value of "height range" previously set as an imaging parameter, and is indicated by a value of 256 gray level obtained by dividing for example "height range" into 0-255 (black-white). The setting value of "height range" may be set changeably.

Figure 7:
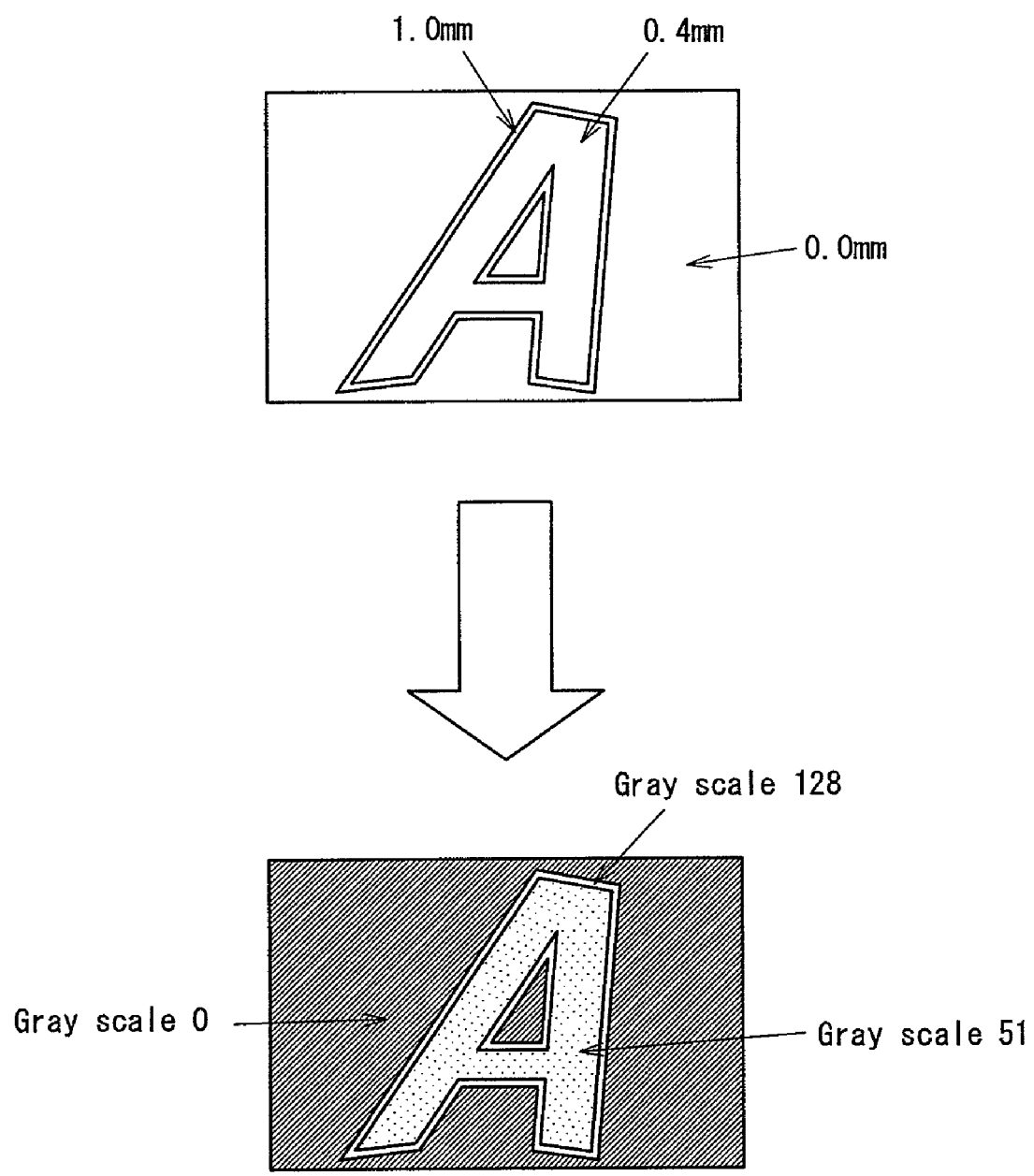
FIG. 7 is a schematic view showing one embodiment of the gray scale transforming process.

FIG. 7 is a schematic view showing one embodiment of the gray scale transforming step. In FIG. 7, the height range is controlled to be 0-2 mm, and the gray scale transformation is performed by using the figure detail information such as a height of 1.0 mm in a region of figure profile line, a height of 0.4 mm in a region of inner profile line and a height of 0 mm in a region of outer profile line. If the height range of 0-2 mm is divided into 256 gray scale, a portion having a height of 1.0 mm becomes a gray scale of 128, a portion having a height of 0.4 mm becomes a gray scale of 51 and a portion having a height of 0 mm becomes a gray scale of 0 (black).

Then, the shape deforming step will be explained. The figure model creating apparatus 11 deforms the image data of the figure as mentioned below by utilizing information of the figure arranging position (R, θ) in the figure detail information.

Figure 8:
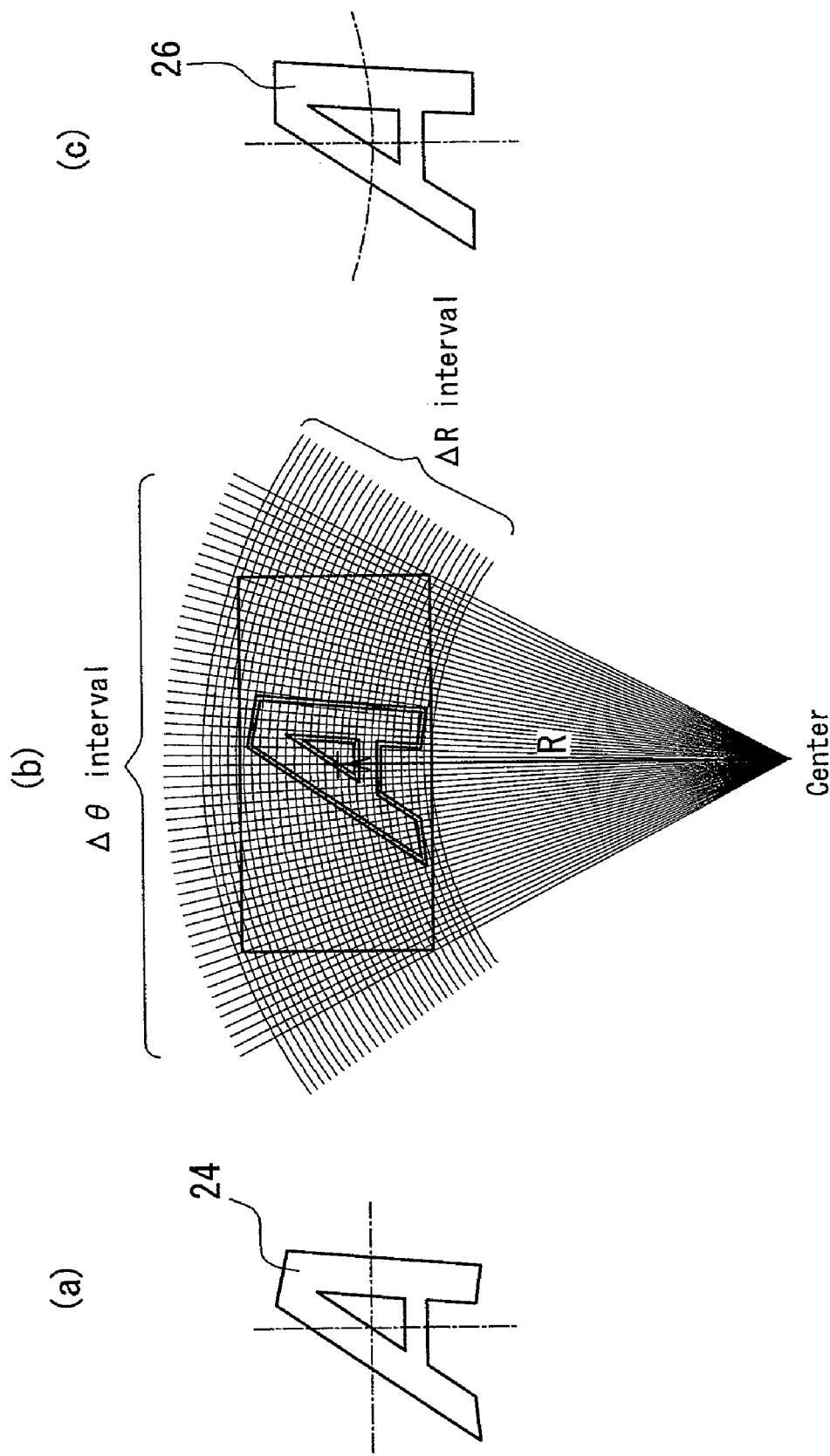
FIGS. 8a to 8c are schematic views respectively explaining the shape transforming process.

First, the image data of a FIG. 24 shown in FIG. 8a are sampled, at a position of a distance R from the tire center as shown in FIG. 8b, in accordance with a sampling interval ΔR from the tire center in a radial direction and a sampling interval Δθ in a circumferential direction of the tire (step 9). The setting value of the sampling interval may be set changeably.

Figure 9:
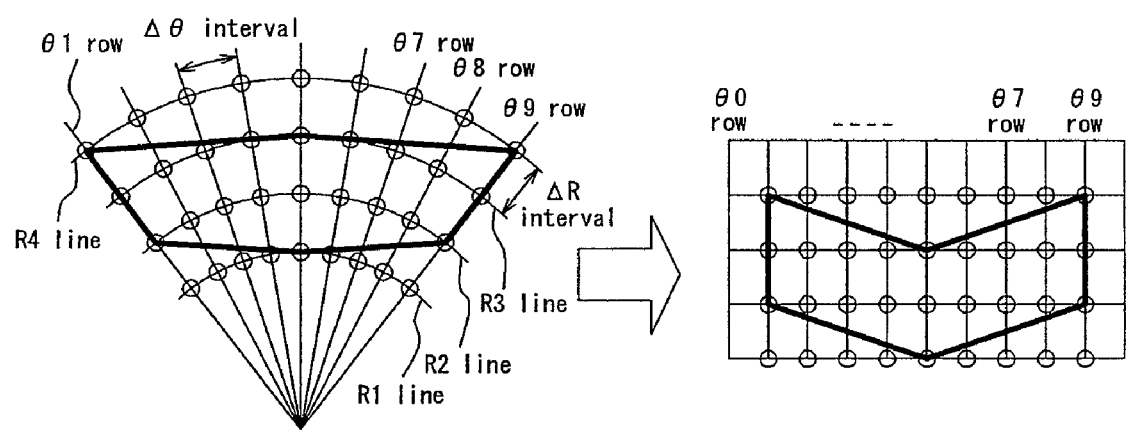
FIG. 9 is a schematic views illustrating the size transformation and the polar coordinate—rectangular coordinates transformation.

Then, the size deformation and the polar coordination—rectangular coordination conversion are performed in such a manner that the intersecting points are arranged at even intervals, so as to obtain the image data of the FIG. 26 shown in FIG. 8c (step 10). FIG. 9 is a schematic view explaining the size deformation and the polar coordination—rectangular coordination conversion. In this manner, the reason for performing the deformation in such a manner that the intersecting points are arranged at even intervals is that it is not affected by the tire size and the master data can be used for various tire sizes. In the present invention, since it is not necessary to create the master data for all the tire sizes respectively, it is possible to minimize a work for constructing the database of the master data.

Figure 10:
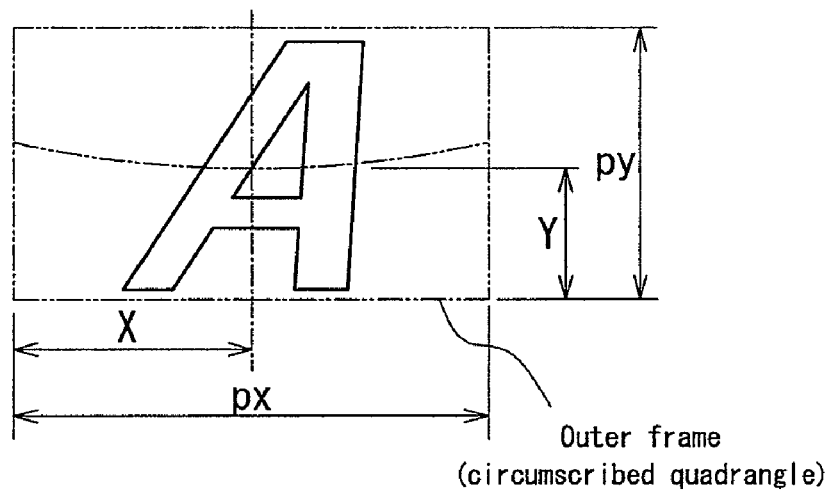
FIG. 10 is a schematic view explaining the image size and the arranging standard position.

The image size of the figure is controlled to be a dimension of the circumscribed quadrangle surrounding the region after deformation. As shown in FIG. 10, the image size becomes a dimension indicated by lateral dimension of outer frame (px)×longitudinal direction of outer frame (py). The arranging standard position (X, Y), which is a standard position when arranging the figure, is defined in such a manner that a left-down corner of the outer frame is a standard point. The image data obtained as mentioned above are registered as the master data having for example a bit map format.

Then, the additional information data table including image number, arranging angle, arranging diameter, arranging standard position, image size, figure attribute flag, front-back determining flag, file name and so on is created (step 11). In FIG. 11, one embodiment of the additional information data table is shown. The figure attribute flag indicates mold number, and character or a kind of figure such as "Made in Japan" on a week serial plate. The front-back determining flag indicates for example whether the figure is arranged in one side or in both sides.

Then, the database is constructed by the master data of the figure whose shape is deformed as mentioned above and the additional information data table (step 12).

In the embodiments mentioned above, the shape deforming process is performed after the gray scale transforming process, but the gray scale transforming process may be performed after the shape deforming process.

The invention claimed is:

1. A method of creating master data used for inspecting a figure having concave and convex portions formed on a surface of tire from tire computer-aided design (CAD) drawings, which have figures deformed according to a tire size and deformed into a sector form according to an arranging position in a radial direction from a tire center, and a height information of respective regions of the figure, comprising the steps of:
   cutting-out an image including the figure by selecting the figure from the tire CAD drawings; and
   transforming respective regions of the cut-out image into a gray scale in accordance with a height information of respective regions obtained from the tire CAD drawings.

2. The method of creating master data used for inspecting a figure having concave and convex portions according to claim 1, further comprising a step of: deforming the cut-out image in accordance with the tire size and the arranging position in a radial direction from the tire center in such a manner that it becomes an original figure before deforming the figure included in the cut-out image into the sector form.

3. A method of creating master data used for inspecting a figure having concave and convex portions formed on a surface of tire from tire computer-aided design (CAD) drawings, which have figures deformed according to a tire size and deformed into a sector form according to an arranging position in a radial direction from a tire center, and a height information of respective regions of the figure, comprising the steps of:
   cutting-out an image including the figure by selecting the figure from the tire CAD drawings;
   transforming respective regions of the cut-out image into a gray scale in accordance with a height information of respective regions obtained from the tire CAD drawings; and
   deforming the image transformed into a gray scale in accordance with the tire size and the arranging position in a radial direction from the tire center in such a manner that it becomes an original figure before deforming the figure included in the image transformed into a gray scale into the sector form.

4. A method of creating master data used for inspecting a figure having concave and convex portions formed on a surface of tire from tire computer-aided design (CAD) drawings, which have figures deformed according to a tire size and deformed into a sector form according to an arranging position in a radial direction from a tire center, and a height information of respective regions of the figure, comprising the steps of:
   cutting-out an image including the figure by selecting the figure from the tire CAD drawings;
   deforming the cut-out image in accordance with the tire size and the arranging position in a radial direction from the tire center in such a manner that it becomes an original figure before deforming the figure included in the cut-out image into the sector form; and
   transforming respective regions of the transformed image into a gray scale in accordance with a height information of respective regions obtained from the tire CAD drawings.

* * * * *